United States Patent [19]

Gergis

[11] 4,301,517

[45] Nov. 17, 1981

[54] REPLICATE/TRANSFER BUBBLE DOMAIN SWITCH

[75] Inventor: Isoris S. Gergis, Yorba Linda, Calif.

[73] Assignee: Rockwell International Corporation, El Segundo, Calif.

[21] Appl. No.: 946,936

[22] Filed: Sep. 29, 1978

[51] Int. Cl.$^3$ .............................................. G11C 19/08
[52] U.S. Cl. ........................................ 365/16; 365/12; 365/39
[58] Field of Search ........................ 365/12, 15, 16, 39

[56] References Cited

U.S. PATENT DOCUMENTS

| | | | |
|---|---|---|---|
| 4,014,009 | 3/1977 | Bonyhard et al. | 365/26 |
| 4,020,476 | 4/1977 | Bonyhard et al. | 365/16 |
| 4,079,461 | 3/1978 | George et al. | 365/15 |
| 4,193,124 | 3/1980 | Bullock | 365/12 |

OTHER PUBLICATIONS

IEEE Transactions on Magnetics, vol. Mag.-13, No. 5, Sep. 1977, pp. 258-260.
IEEE Transactions on Magnetics, vol. Mag.-14, No. 1, Jan. 1978, pp. 1-4.

*Primary Examiner*—James W. Moffitt
*Attorney, Agent, or Firm*—H. Fredrick Hamann; Daniel R. McGlynn

[57] ABSTRACT

An active replicate/transfer magnetic bubble domain switch which is especially compatible with gap tolerant structures is provided. The switch includes a broad-faced corner element of relatively massive structure which retains the bubble domain for more than one field cycle. The switch characteristics are superior to those of existing switches both at the 8 $\mu$m and 16 $\mu$m periods. The switch offers the advantages of good bias and phase margins, ease of fabrication and reduced drive field requirements. In the 8 $\mu$m, version the device requires a substantially lower drive field than the pickax design by virtue of reduced bubble-bubble interaction in the minor loops.

15 Claims, 6 Drawing Figures

REPLICATE/TRANSFER BUBBLE DOMAIN SWITCH

BACKGROUND OF THE INVENTION

1. Field of the Invention

This invention relates to magnetic bubble domain structures, in general, and to an improved switch structure, in particular.

2. Prior Art

Several state of the art bubble replicators operate in what is called the cut and transfer mode. Among these replicators are the pickax and the sideways switches. In these switches the bubble stretches along its propagation path under the influence of the strong pole distribution on an oversized permalloy element that constitutes part of the switch. The replication is effected by applying to the control conductor a composite current pulse consisting of a large narrow pulse followed by a low current plateau that lasts for a little over a quarter of a field cycle. The bubble is elongated normal to the control conductor and is cut into two parts (i.e. two bubbles). The trailing bubble is subsequently transferred with the aid of the low current plateau into the secondary propagation track which is placed near the switch.

Considerable progress has recently taken place in the design of field access bubble domain devices with the introduction of the gap tolerant structure based on the half disk pattern and its variations. See, for example, I. S. Gergis, P. K. George, and T. Kobayashi, "Gap Tolerant Bubble Propagation Circuit", *IEEE Trans. Magnetism MAG*-12, p. 651 (1976). The fact that the minimum feature of this pattern is about $\frac{1}{8}$ of the circuit period makes it possible to fabricate 8 $\mu$m period devices using conventional photolithographic techniques. P. I. Bonyhard and J. L. Smith, "68 K Bit Capacity 16 $\mu$m Period Magnetic Bubble Memory Chip Design with 2 $\mu$m Minimum Features", *IEEE Trans. Magnetism MAG*-12, p. 614 (1976) reports a 16 $\mu$m period switch design, based on the pickax element, which operates with adequate bias and phase margins. However, this design suffers the disadvantages of upper and lower margin degradation in the minor loop propagation due to failures at the pickax element as discussed in their publication. Also, non-volatile start/stop operation requires a relatively large holding field to alleviate the degradation in the operation due to the failure caused by the bubble attraction to the pickax tail, or one pole compensating bars, during the drive-field shut down.

In scaling down the pickax switch design to an 8 $\mu$m period, several additional problems arise. The drive field required for successful operation increases to more than 50 Oe, mainly due to the increase in bubble-bubble interaction in the unevenly spaced tracks of the minor loops, as a result of the increase in the garnet magnetization. The control conductor width is reduced to less than 2 $\mu$m making it difficult to reproduce, especially with the requirement of the conductor edge sloping for proper permalloy step coverage. It is highly desirable to eliminate or avoid these problems.

PRIOR ART STATEMENT

The prior art known to Applicant and having some relevance to the instant invention is listed herewith.

U.S. Pat. No. 4,079,461 which relates to gap tolerant bubble domain structures.

U.S. Pat. No. 4,007,453 which relates to a magnetic bubble memory organization including a pick-ax switch pattern.

U.S. Pat. No. 4,012,726 which relates to a magnetic bubble domain replicator element having a relatively massive structure with the ends thereof pointing at each other and a separate conductor loop parallel to said ends.

U.S. Pat. No. 4,020,476 which relates to a crossing of conductors and permalloy in magnetic bubble domain structures but includes a relatively massive turn element with conductors very carefully oriented thereto in order to avoid bubble obstruction.

U.S. Pat. No. 4,056,812 which relates to a fault tolerant magnetic bubble memory which includes a relatively massive structure (without an associated conductor loop.)

Gergis and Kobayashi, "Replicate/Transfer Bubble Switch", *IEEE Trans. on Magnetism*, Vol. MAG-14, No. 1, p. 1, 1978, which includes a description of this invention.

SUMMARY OF THE INVENTION

The active switch design of the invention is based upon a broad-faced, fairly massive corner element. The element is comprised, typically, of permalloy. The element "retains" the bubble domain thereon for more than one field cycle and thereby achieves desirable characteristics. The end pole pieces are arranged substantially normal to each other and are spaced apart one from the other. The end pole pieces are relatively small in comparison to the main "body" of the element. A control conductor engages the main body structure to control the bubble status relative to the element.

This new switch design is based on the principle of stretching, then cutting the bubble by control current pulses. In this mode of operation the bubble is stretched, under the influence of a large amplitude current pulse in the control conductor, between the switch propagate element in a primary track and another propagate element in a secondary track. The bubble strip is permitted to propagate for a fraction of a field cycle after which a second, large amplitude, narrow pulse is applied to the control conductor to sever the bubble strip into two parts. One part of the bubble propagates as would the original bubble in the primary track, and the second part of the bubble propagates in the secondary track. This switch is compatible with gap tolerant structures.

DESCRIPTION OF A PREFERRED EMBODIMENT

Figure 1:
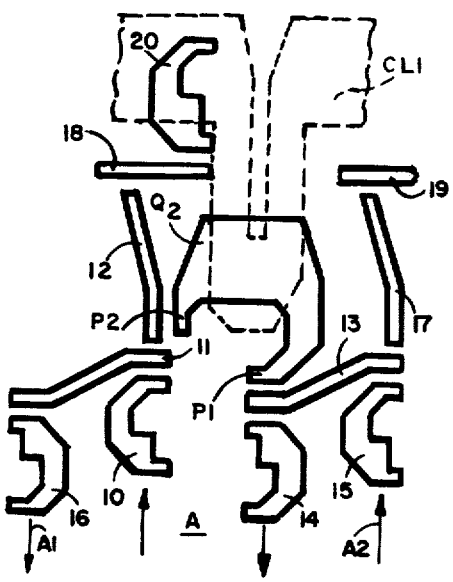
FIG. 1 illustrates a preferred embodiment of the instant invention.

In FIG. 1, there is shown a corner element Q2 which is associated with a secondary (minor) loop A. Minor loop A includes elements 10, 11, 12, 13, 14 and Q2. Similarly, elements 11 and 16 form a portion of minor loop A1. Transitional elements 18 and 20 are arranged to transfer bubbles from minor loop A to a primary (major) loop. Transitional element 20 may form a part of the major loop, per se, or it may be an intermediate transitional element between the major and the minor loops. Conductor loop CL1 (shown dashed) is substantially normal to bubble propagation through the minor loop. Conductor CL1 is, furthermore, arranged adjacent to the elements so that a control current can be selectively applied thereto in order to selectively control the transfer of bubbles from the minor loop to the major loop. In addition, elements 13, 15, 17 and 19 form a portion of minor loop A2.

It is clear that the switch design is based on a broad-faced corner element on which the bubble stretches with the aid of a fairly massive permalloy structure. In this switch the bubble stays on the corner element Q2 for more than one field cycle (about $5\pi/2$). Hence, this element is called a "five-halves-$\pi$" corner element. Consequently, two bubbles coexist on the corner element for a fraction of a field cycle. This condition, however, does not cause any adverse effect because the pole strength on the corner element is large enough to overcome the repulsive permalloy-mediated bubble-bubble interaction. Moreover, the $5\pi/2$ corner element is no larger than the other elements in terms of the spacing and cycle operation. Unlike the pickax, the instant switch permits more equal spacing between the minor loop tracks, thus, reducing bubble-bubble interaction. Furthermore, by doing away with the pickax-tail for bubble stretching, both the upper and the lower margin losses that are peculiar to the pickax design are eliminated.

In the operation of the embodiment shown in FIG. 1, the bubble domains propagate through the storage or minor loop A in the direction suggested by the arrows, in response to the application of a clockwise rotating field $H_R$. In typical fashion, a bubble propagates along the outer periphery of element 10 and is transferred to the end of twisted element 12 via twisted I-bar element 11. Substantially concurrently, the bubble is also transferred to the magnetic pole end P2 of corner element Q2. The bubble continues to propagate around the periphery of corner element Q2 until it reaches pole end P1 at which time it is substantially concurrently transferred to the left end of twisted I-bar 13 and the end of element 14. It should be noted that the bubble is transferred to pole end P2 of element Q2 when rotating field $H_R$ is directed downward (180°). The bubble then begins to propagate around the periphery of element Q2 until the bubble is disposed at pole P1 when the rotating field has reached the 270° left position. It will be noted that the rotating field has made a complete cycle from the +180° position (downward) through the 270° position, back through the +180° position and the bubble reaches pole P1 only when the field $H_R$ has reached the 270° position for the second time after the bubble has been transferred to the corner element Q2. It is clear, that if bubbles are propagating consecutively along minor loop A, a second bubble will have been transferred to pole P2 while the first bubble is still progressing along the right periphery of element Q2 and approaching pole P1. However, as noted above, this multiple bubble condition causes no problem because of the relative size of corner element Q2.

Figure 2:
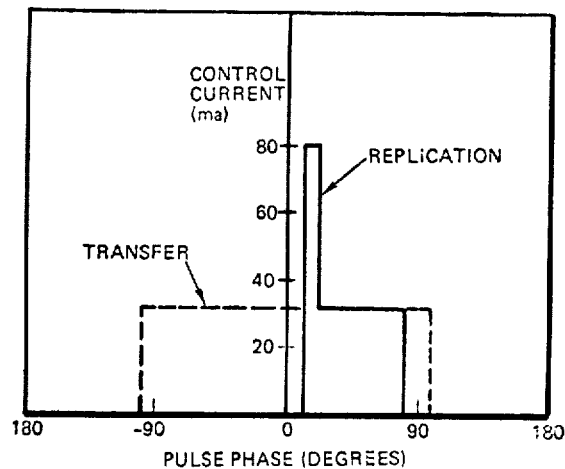
FIG. 2 describes typical control current pulses for replication and transfer operations of the invention.

In order to effect a transfer of a bubble domain from the minor loop to the major loop, a transfer control current pulse is supplied to conductor CL1. As shown in FIG. 2, the current pulse is applied at approximately the 270° position of the rotating field. That is, the control pulse is supplied to conductor CL1 when the rotating field $H_R$ is pointing leftward. The transfer control current pulse is maintained on conductor CL1 until rotating field $H_R$ reaches a position greater than the 0° phase. That is, the bubble, in response to the rotating field, propagates around the periphery of element Q2, is blocked (attracted) by conductor CL1 and extends along the left edge thereof to the left pole end of element 18. When the rotating field reaches the +90° phase again, the bubble is attracted to the left pole portion of element 18 and is, thereby, extracted from the minor loop and supplied to the major loop.

In order to effect a replication operation, the control pulse is supplied to conductor CL1 when the bubble has reached the 0° phase of the rotating field. That is, the bubble is stretched along the outer peripheral edge of the corner element Q2. The control pulse applied to conductor CL1 is of such magnitude and direction that a cutting or splitting effect occurs relative to the stretched bubble. Thus, one portion of the bubble is effectively drawn to element 18 along one portion of the conductor loop while the other portion of the bubble is repelled toward the right side of element Q2 by the other portion of the conductor loop. The separate bubbles are then maintained separated by the magnetic field produced at conductor CL1 so that the severed bubble is attracted to element 18 and the other (original) bubble continues to propagate towards pole P1. Thus, bubble replication is achieved by means of this pattern.

In the above switch the minimum conductor line width is about 3 $\mu$m (8 $\mu$m period) which allows for easier fabrication and reduced resistance of the control conductor.

The switch was incorporated into a test chip which contained a number of major-minor loops sets for testing different switch designs. The pickax switch was also included in the test chip for comparison. Each test set contains a generator, a write loop, and 8 minor loops. Each minor loop is 67 bits long. The replicate switch output merges into a common read loop which leads into a detector. The device was fabricated in two versions one with 8 $\mu$m period (with minor loop separation of 18 $\mu$m) and the other in 16 $\mu$m period. Typical material and device parameters are shown in Table 1.

Table I

| DEVICE PERIOD | GARNET COMPOSITION | $w_s$ $\mu$m | h $\mu$m | $H_c$ Oe | $4\pi Ms$ G | 1st SiO$_2$ A° | AlCu A° | 2nd SiO$_2$ A° | NiFe A° |
|---|---|---|---|---|---|---|---|---|---|
| 16$\mu$m | (YSm)$_3$(FeGa)$_5$O$_{12}$ | 3.6 | 3.3 | 117 | 230 | 1000 | 4000 | 6000 | 4000 |
| 8$\mu$m | (YSmTm)$_3$(FeGa)$_5$O$_{12}$ | 1.8 | 1.7 | 218 | 420 | 1000 | 3000 | 3000 | 3000 |

The switch characterization is performed by first inserting ten (10) blocks of data, each 8 bits wide, into the minor loops. The data are replicated out several times and detected in the detector. The data are then erased and new data are written and so forth. Bias field pulsing and drive field modulation techniques were used to determine the bias-drive field characteristics of the switch and its vicinity in the minor loops. The field pulse spans five cycles with the replication or transfer occurring at about the mid-interval. The control current pulses shown in FIG. 2 and used for the switch shown in FIG. 1 are very similar to those used with the pickax switch described by Bonyhard and Smith, as noted above. The characterization was made at room temperature and 150 KHz.

Figure 3:
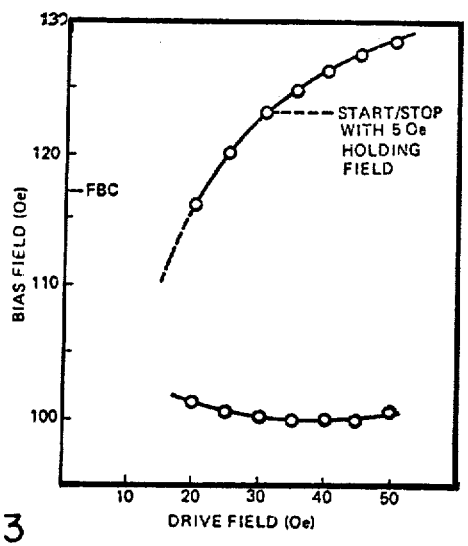
FIG. 3 shows the bias-drive field characteristics for the switch embodiment shown in FIG. 1.
Figure 4:
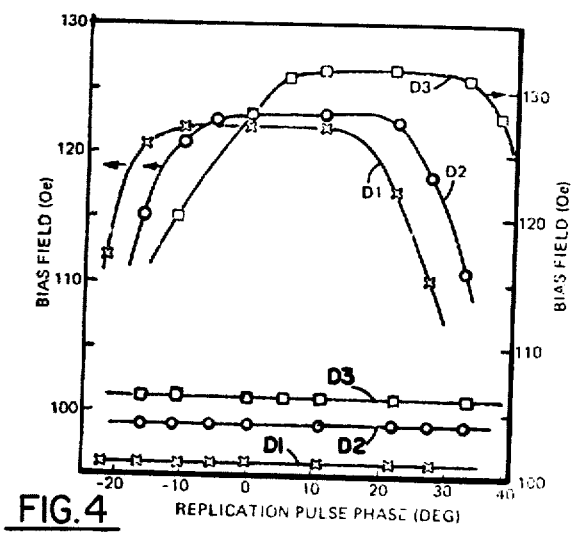
FIG. 4 shows the bias-phase characteristics of the switch element embodiment shown in FIG. 1 as a function of conductor alignment.

The results obtained for the preferred switch design of FIG. 1 in the 16 $\mu$m devices are shown in FIGS. 3 and 4. At a drive field of 35 Oe, the bias margin range is 25 Oe (23%) for both replication and transfer. This closely approaches the bias margin range for propagation in the straight section of the minor loops as obtained using the field pulsing technique. A good replication phase margin range of close to 40° is obtained with this switch (FIG. 4).

To assess the alignment tolerance of the switch of FIG. 1, several devices were fabricated with some lateral misalignment of the control conductor CL1 relative to the permalloy pattern, especially element Q2. Three devices were chosen in which the misalignment varies from $-1.2$ $\mu$m (left) to $+1.5$ $\mu$m (right). The phase-versus-bias characteristics of the replication function in these devices are shown in FIG. 2. It can be seen that about 20 degrees overlap is obtained in the phase margins of these three devices. Also noted is the fact that the bias margin did not suffer any degradation due to the misalignment. However, the low current plateau in the replicate double pulse (and also the transfer pulse) required to attain the full bias margin increases to about 35 ma for the device with $+1.5$ $\mu$m alignment. The minimum transfer current pulse for the other alignments is about 15–20 ma.

The amplitude of the replication and transfer pulses (as well as the low current plateau in replication) range from 60 ma to over 100 ma, and from 20 ma to over 45 ma, respectively, without any noticeable change in the bias margin.

Figure 5:
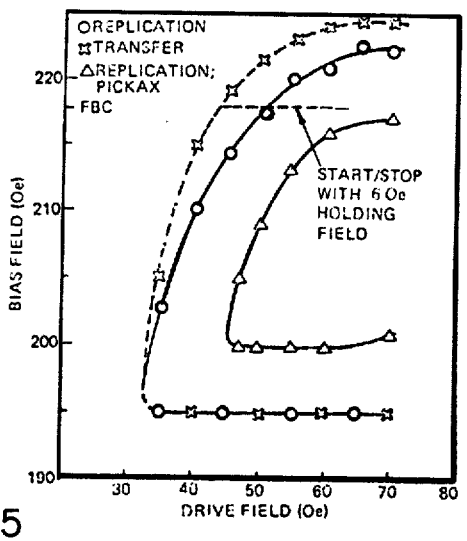
FIG. 5 shows the bias-drive field characteristics for the switch embodiment shown in FIG. 1 when compared to a pick-ax switch.
Figure 6:
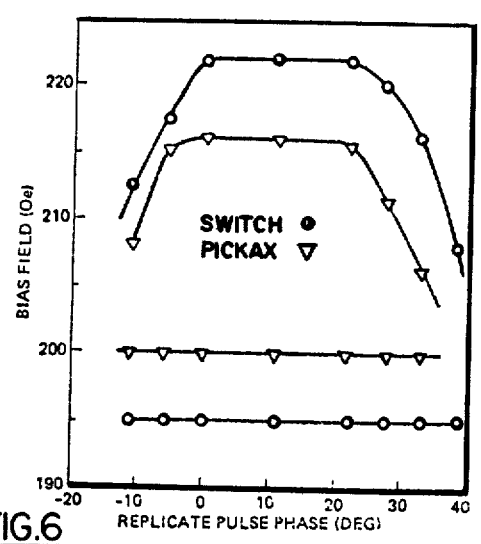
FIG. 6 shows the relative replication bias-phase characteristics of the switch embodiment of FIG. 1 when compared to the pick-ax switch.

It should be noted that especially in the 8 $\mu$m version, the switch shown in FIG. 1 shows a substantial advantage over the pickax, particularly in lower drive field requirement. At 50 Oe drive, the bias margins for replication and transfer are about 22 Oe and 25 Oe, respectively. This is compared to the pickax which requires 60 Oe drive to attain 16 Oe replication bias margin. It is also illustrated in FIG. 5 that the minimum drive field of the pickax is substantially higher than the switch shown in FIG. 1 (47 Oe versus 35 Oe). Visual observation shows that the main reason for the lower drive field in the switch of FIG. 1 (compared to the pickax) is the reduced bubble interaction between the adjacent tracks of the minor loops as a result of the rearrangement of the half disk element as explained earlier. The bubble-bubble interaction is proportional to the garnet magnetization which, in the 8 $\mu$m devices described here, is about twice as large as the garnet magnetization used in the 16 $\mu$m devices (see Table I).

Thus, there has been shown and described an active replicate/transfer switch, the bias margin of which closely approaches that of the straight line propagation in the minor loops. This switch design is intended to improve the replicate phase margin over that of the pickax-type replicators (cut and transfer mode) by using a replicator which operates in the stretch-and cut mode and which is also compatible with gap tolerant structures. A good phase margin is also obtained and is reflected in an alignment tolerance larger than $\pm 1.5$ $\mu$m in the 16 $\mu$m period devices. Also, corner element Q2 permits staggering the half disk elements of the two sides in a minor loop, which results in a further reduction in bubble-bubble interaction between the adjacent tracks. Also, corner element Q2 does not degrade the minor loop propagation margin relative to straight line propagation. The description is intended to be illustrative only and not limitative. The scope of the invention is limited only by the claims appended hereto.

Having thus described a preferred embodiment of the invention, what is claimed is:

1. An active replicate/transfer switch for magnetic bubble domain systems comprising:
   first and second propagation path means;
   corner element means included in said first propagation path means;
   conductor means disposed adjacent a side of said corner element means so as to define a loop which is substantially perpendicular to said side, the apex of the loop being disposed under said corner element;
   said corner element means having a pair of pole ends;
   said pole ends spaced apart and arranged substantially normal to each other such that a bubble domain can propagate around the periphery of said corner element means for more than one full cycle of the applied rotating magnetic field.

2. The switch recited in claim 1 wherein
   said pole ends are offset relative to each other such that the elements of said first propagation path means are offset relative to each other.

3. The switch recited in claim 1 wherein
   said second propagation path means includes elements which are disposed adjacent to said conductor means whereby bubble domains can be transferred thereto along said conductor means.

4. The switch means recited in claim 1 wherein
   said corner element means and said first propagation path means related so that two consecutive bubbles can be located at said corner element means concurrently.

5. The switch means recited in claim 1 wherein
   said bubble domain remains on said corner element means for $5\pi/2$ cycles of said applied rotating field.

6. The switch recited in claim 1 wherein
   elements of said first and second propagation paths and said corner element means are gap tolerant structures.

7. The switch recited in claim 1 wherein,
   a transfer function is obtained by applying a relatively constant control signal to said conductor means for approximately one half of a cycle of the applied rotating magnetic field.

8. The switch recited in claim 1 wherein,
   a replicate function is obtained by applying a cutting control signal for approximately one twentieth of a cycle of the applied rotating magnetic field followed by a transferring control for approximately one fifth of said cycle.

9. The switch recited in claim 8 wherein, said cutting control signal has a substantially larger amplitude than said transferring control signal.

10. The switch recited in claim 1 wherein,
said first and second propagation path means and said corner element means are fabricated of permalloy.

11. The switch recited in claim 1 wherein,
said conductor means is formed of a layer of material separate from said corner element means.

12. The switch recited in claim 1 wherein,
said first propagation path is a minor loop, and
said second propagation path is a major loop.

13. A magnetic bubble domain system comprising:
a plate of magnetic material capable of supporting magnetic bubble domains, including a first path for transporting domains comprising a plurality of spaced apart magnetically operative discrete elements, and a current conductor;
said first path including a corner element, including a first pole end portion, a second portion adjacent and substantially normal to said first pole end portion, a third portion adjacent and substantially normal to said second portion, and a second pole end portion adjacent and substantially normal to said third portion;
said current conductor comprising a loop having an apex disposed substantially under said second portion of said corner element.

14. A system as defined in claim 13, wherein:
said second portion of said corner element is substantially wider than said first pole end portion, said third portion, and said second pole end portion.

15. A system as defined in claim 13, wherein:
said first and said second pole end portions are spaced apart and disposed substantially normal to each other.

* * * * *